(12) United States Patent
Ganesan et al.

(10) Patent No.: US 11,374,601 B2
(45) Date of Patent: Jun. 28, 2022

(54) INTERLEAVING ADC ERROR CORRECTION METHODS FOR ETHERNET PHY

(71) Applicant: TEXAS INSTRUMENTS INCORPORATED, Dallas, TX (US)

(72) Inventors: Raghu Ganesan, Bengaluru (IN); Saravanakkumar Radhakrishnan, Aruppukottai (IN); Kalpesh Laxmanbhai Rajai, Bengaluru (IN); Soumyajit Roul, Bengaluru (IN); Sumantra Seth, Bengaluru (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 17/200,426

(22) Filed: Mar. 12, 2021

(65) Prior Publication Data

US 2021/0288656 A1 Sep. 16, 2021

(30) Foreign Application Priority Data

Mar. 13, 2020 (IN) .............................. 202041010814
Mar. 13, 2020 (IN) .............................. 202041010817
Mar. 13, 2020 (IN) .............................. 202041010820

(51) Int. Cl.
*H04B 1/10* (2006.01)
*H04B 1/12* (2006.01)
(Continued)

(52) U.S. Cl.
CPC .......... *H04B 1/1036* (2013.01); *H03M 1/004* (2013.01); *H03M 1/0604* (2013.01);
(Continued)

(58) Field of Classification Search
CPC .. H03M 1/004; H03M 1/0604; H03M 1/0687; H03M 1/502; H03M 1/0624;
(Continued)

(56) References Cited

U.S. PATENT DOCUMENTS 1,115,040 A * 10/1914 Voight .................... E05B 29/00
 70/342
9,077,574 B1 * 7/2015 Healey .............. H04L 25/03057
(Continued)

FOREIGN PATENT DOCUMENTS

EP 0929945 12/2005
EP 2806570 11/2014

OTHER PUBLICATIONS

International Search Report in corresponding PCT Application No. PCT/US2021/022351, dated Jun. 24, 2021 (4 pages).
(Continued)

*Primary Examiner* — Lam T Mai
(74) *Attorney, Agent, or Firm* — John R. Pessetto; Charles A. Brill; Frank D Cimino

(57) ABSTRACT

A receiver circuit includes an interleaved ADC, a first delay circuit, a second delay circuit, a first processing channel, a second processing channel, and an interleaving ADC timing error detector circuit. The interleaved ADC includes a first ADC and a second ADC in parallel. The first delay circuit delays a first clock signal provided to the first ADC. The second delay circuit delays a second clock signal provided to the second ADC. The first processing channel processes data samples provided by the first ADC, and includes a first slicer. The second processing channel processes data samples provided by the second ADC, and includes a second slicer. The interleaving ADC timing error detector circuit controls delay of the first delay circuit and the second delay circuit based on an output signal of the first slicer, and an output signal or an input signal of the second slicer.

28 Claims, 8 Drawing Sheets

(51) Int. Cl.
*H04B 1/16* (2006.01)
*H03M 1/00* (2006.01)
*H03M 1/06* (2006.01)
*H03M 1/50* (2006.01)

(52) U.S. Cl.
CPC ......... *H03M 1/0687* (2013.01); *H03M 1/502* (2013.01); *H04B 1/12* (2013.01); *H04B 1/1607* (2013.01); *H04B 2001/1063* (2013.01)

(58) Field of Classification Search
CPC .................. H03M 1/0836; H03M 1/1215; H04B 1/1036; H04B 1/12; H04B 1/1607; H04B 1/0007
USPC .................................................. 341/130–160
See application file for complete search history.

(56) References Cited

U.S. PATENT DOCUMENTS

| | | | |
|---|---|---|---|
| 9,215,107 B1* | 12/2015 | De Bernardinis | H04L 7/0062 |
| 9,673,910 B1* | 6/2017 | Crivelli | H04B 10/6161 |
| 10,203,809 B2 | 2/2019 | Sobel et al. | |
| 10,536,155 B1 | 1/2020 | Otte | |
| 10,720,936 B1* | 7/2020 | Xu | H03M 1/126 |
| 11,063,793 B1* | 7/2021 | Xavier | H04L 25/03885 |
| 2003/0072059 A1 | 4/2003 | Thomas et al. | |
| 2003/0099208 A1 | 5/2003 | Graziano et al. | |
| 2007/0133719 A1* | 6/2007 | Agazzi | H03M 1/44 375/350 |
| 2008/0240325 A1* | 10/2008 | Agazzi | H04L 7/0083 375/371 |
| 2009/0135035 A1 | 5/2009 | Fifield | |
| 2009/0185613 A1* | 7/2009 | Agazzi | H03M 1/0626 375/232 |
| 2009/0207925 A1 | 8/2009 | Liu | |
| 2010/0309963 A1 | 12/2010 | Agazzi et al. | |
| 2011/0211842 A1* | 9/2011 | Agazzi | H04B 10/40 398/141 |
| 2014/0064352 A1 | 3/2014 | Zhong | |
| 2014/0266823 A1 | 9/2014 | Biallais et al. | |
| 2014/0348276 A1 | 11/2014 | Pandey et al. | |
| 2016/0308627 A1 | 10/2016 | Park et al. | |
| 2017/0070952 A1 | 3/2017 | Balakrishnan et al. | |
| 2019/0173480 A1 | 6/2019 | Ryu et al. | |
| 2020/0092053 A1 | 3/2020 | Bai et al. | |
| 2021/0028791 A1* | 1/2021 | Xu | H03M 1/204 |
| 2021/0218604 A1 | 7/2021 | Wu et al. | |
| 2021/0288684 A1* | 9/2021 | Ganesan | H03M 1/0604 |

OTHER PUBLICATIONS

International Search Report in corresponding PCT Application No. PCT/US2021/022349, dated May 27, 2021 (2 pages).
International Search Report in corresponding PCT Application No. PCT/US2021/022344, dated Jun. 17, 2021 (2 pages).

* cited by examiner

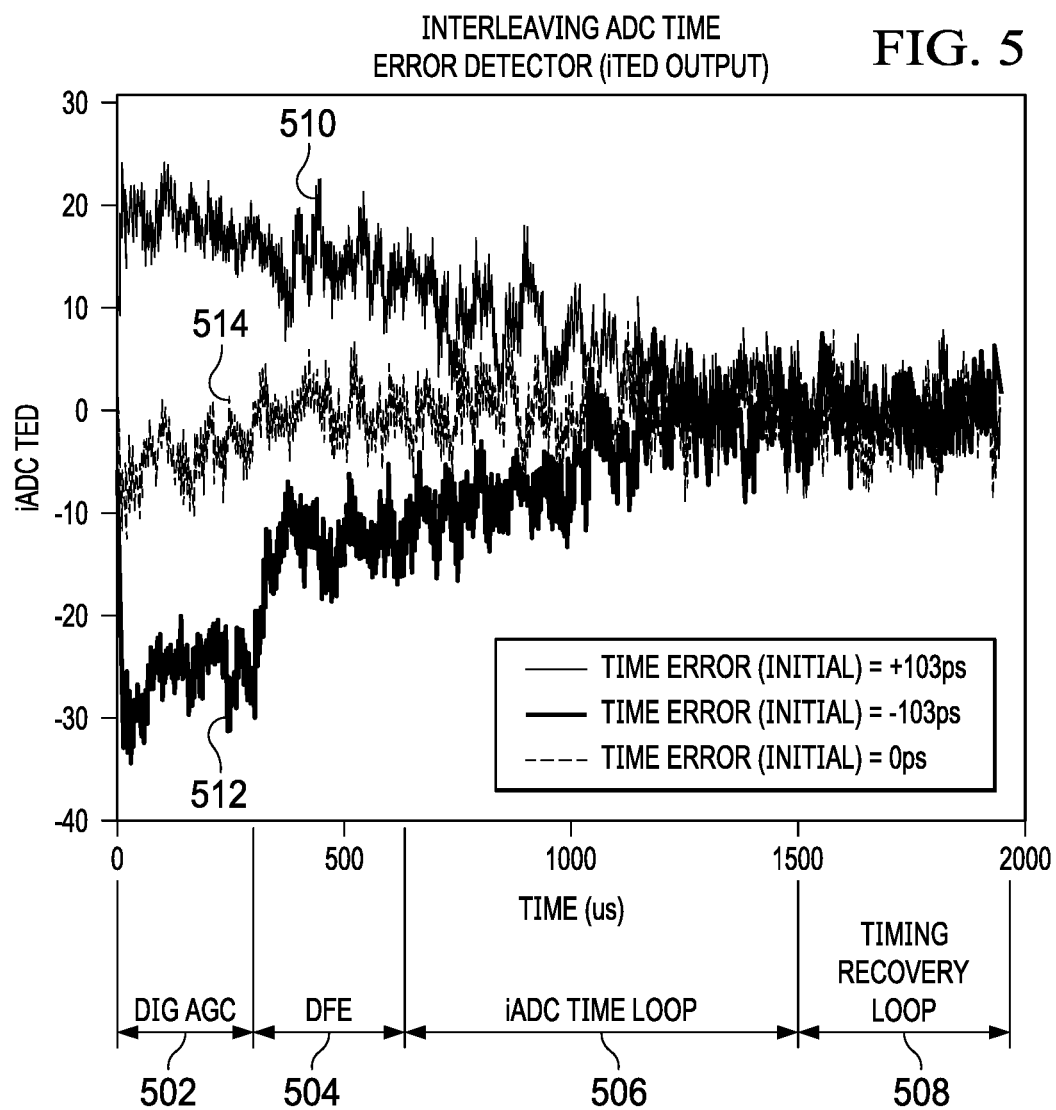

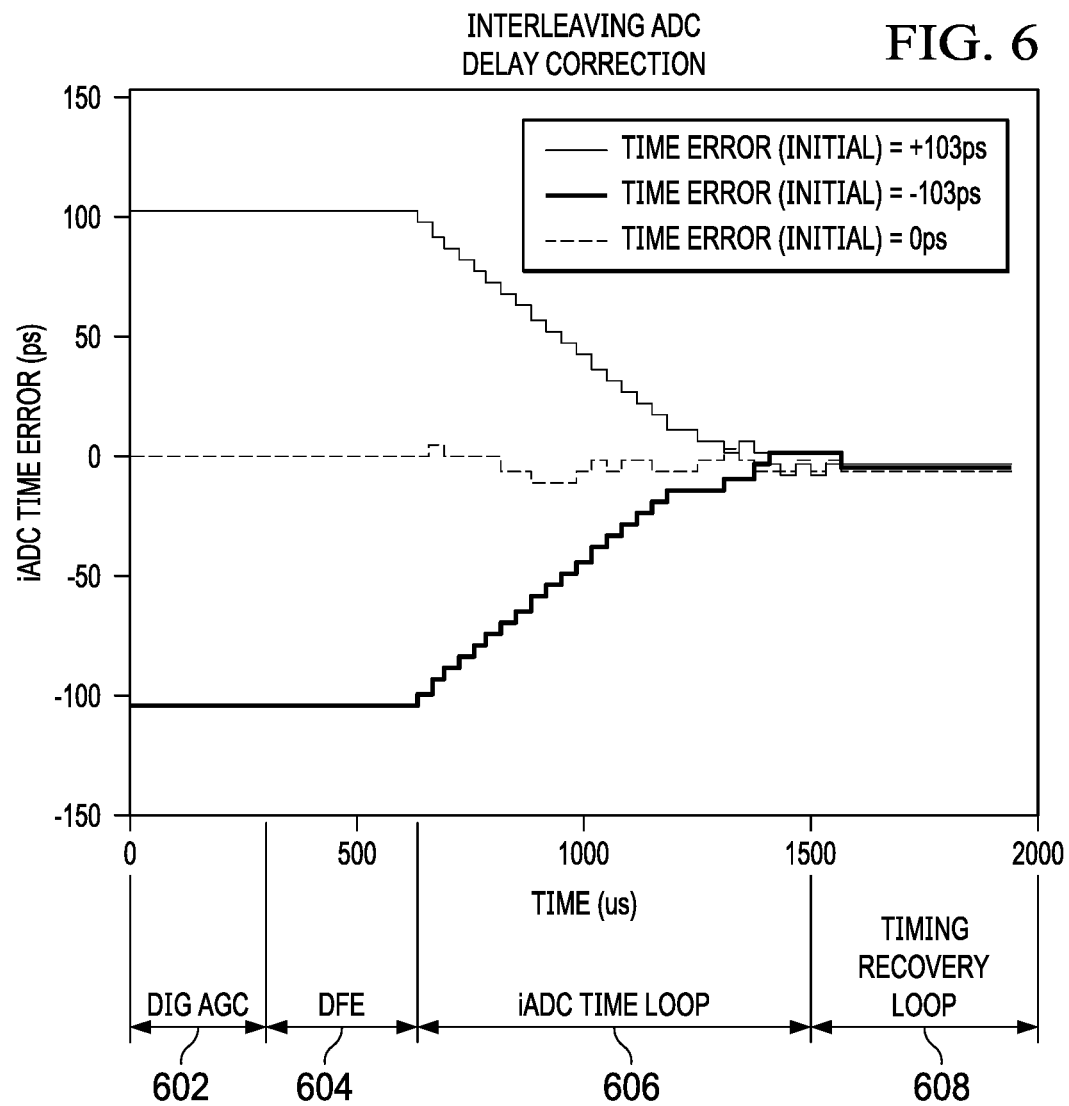

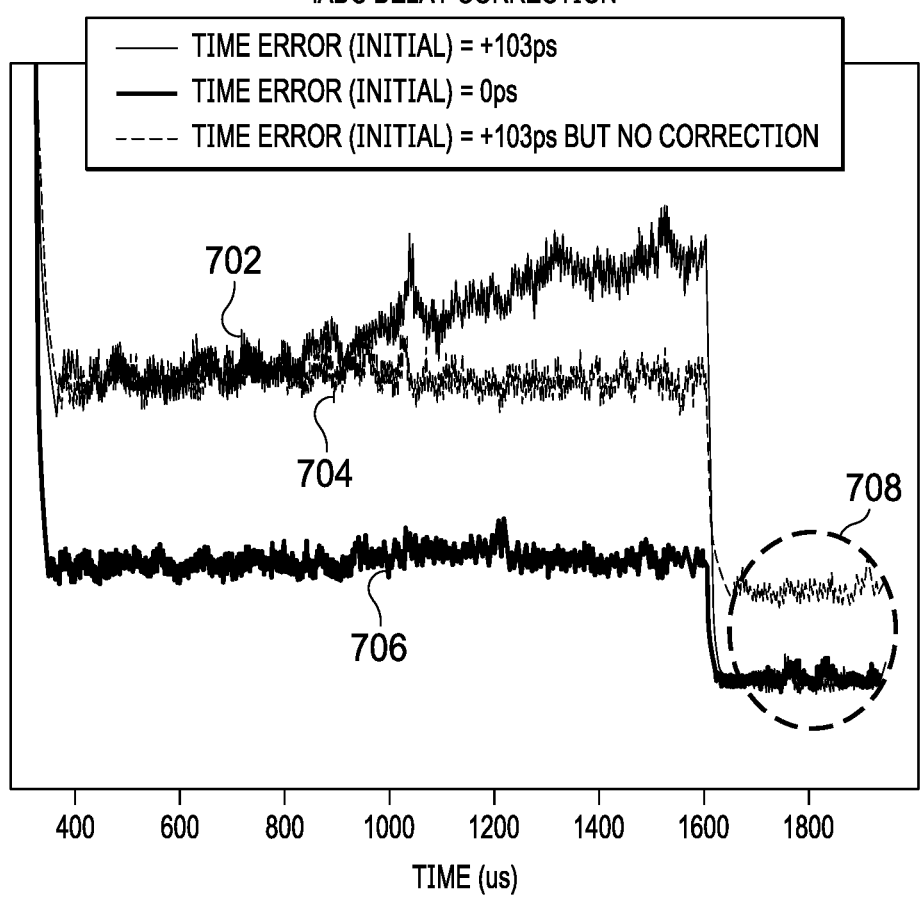

INTERLEAVING ADC ERROR CORRECTION METHODS FOR ETHERNET PHY

CROSS-REFERENCE TO RELATED APPLICATIONS

This application claims priority to India Provisional Application 202041010820, filed Mar. 13, 2020, titled "Interleaving ADC Error Correction Methods for Ethernet PHY," India Provisional Patent Application No. 202041010814, filed Mar. 13, 2020, titled "Novel Low Power Methods For Signal Processing Blocks In Ethernet PHY," and India Provisional Application 202041010817, filed Mar. 13, 2020, titled "Radio Frequency Interference (RFI) Mitigation for Wireline Applications," each of which is hereby incorporated by reference in its entirety. U.S. patent application Ser. No. 17/199,142, filed Mar. 11, 2021, titled "Low Power Methods for Signal Processing Blocks in Ethernet PHY" is also hereby incorporated by reference herein in its entirety.

BACKGROUND

As the operating frequency and complexity of electronic devices (for example, Ethernet transceivers) increases, the analog-to-digital converters (ADCs) included in the devices must operate at higher sampling rates. Typically, an ADC that is capable of operating at sufficiently high sampling rates must trade-off conversion resolution for the high sampling rate. A time-interleaved ADC array is commonly used when a single ADC is not capable of meeting the needed sampling rate while providing the desired conversion resolution. A time interleaved ADC array includes multiple ADCs arranged in parallel fashion with a signal to be converted being provided to each of the multiple ADCs. Each of the ADCs is responsible for converting only a portion of the signal and therefore can perform the conversion at a slower rate. For example, if a time interleaved ADC array has M ADCs arranged in parallel fashion, where M is an integer number, then each of the M ADCs is only required to be able to convert the signal at 1/M-th of the desired sampling rate.

SUMMARY

In one example, a receiver circuit includes an interleaved analog-to-digital converter (ADC), a first delay circuit, a second delay circuit, a first-in-first-out (FIFO) memory, a processing channel, and an interleaving ADC timing error detector circuit. The interleaved ADC includes a first ADC and a second ADC. The first ADC includes a clock input. The second ADC includes a clock input and is coupled in parallel with the first ADC. The first delay circuit includes a clock input, a control input, and a clock output. The clock input is coupled to a clock source. The clock output is coupled to the clock input of the first ADC. The second delay circuit includes a clock input, a control input, and a clock output. The clock input of the second delay circuit is coupled to the clock source. The clock output of the second delay circuit is coupled to the clock input of the second ADC. The FIFO memory is coupled to the interleaved ADC. The processing channel is coupled to the FIFO memory. The processing channel includes a slicer. The slicer includes an output. The interleaving ADC timing error detector circuit includes an input, a first output, and a second output. The input of the interleaving ADC timing error detector circuit is coupled to the output of the slicer. The first output of the interleaving ADC timing detector circuit is coupled to the control input of the first delay circuit. The second output of the timing detector circuit is coupled to the control input of the second delay circuit.

In another example, a receiver circuit includes an interleaved ADC, a first delay circuit, a second delay circuit, a first processing channel, a second processing channel, and an interleaving ADC timing error detector circuit. The interleaved ADC includes a first ADC and a second ADC in parallel with the first ADC. The first delay circuit is configured to a delay a first clock signal provided to the first ADC. The second delay circuit is configured to delay a second clock signal provided to the second ADC. The first processing channel is configured to process data samples provided by the first ADC, and includes a first slicer. The second processing channel is configured to process data samples provided by the second ADC, and includes a second slicer. The interleaving ADC timing error detector circuit is configured to control a first delay of the first delay circuit and a second delay of the second delay circuit based on an output signal of the first slicer, and an output signal or an input signal of the second slicer.

In a further example, a receiver circuit includes an analog front-end circuit and a digital signal processing circuit. The analog front-end circuit includes an interleaved ADC. The interleaved ADC includes a first ADC and a second ADC. The digital signal processing circuit is coupled to the analog front-end circuit, and a first processing channel, a second processing channel, and an ADC gain control circuit. The ADC gain control circuit is configured to adjust an amplitude of data samples provided by the second ADC based on input of the first slicer, output of the first slicer, input of the second slicer, and output of the second slicer.

In a yet further example, a method includes digitizing a signal using a first analog-to-digital converter (ADC) and a second ADC of an interleaving ADC. A timing error of the second ADC relative to the first ADC is determined by comparing inter-symbol interference (ISI) in the samples of the first ADC and ISI in the samples of the second ADC. A timing of a first clock provided to the first ADC or a timing of a second clock provided to the second ADC is adjusted based on the timing error.

BRIEF DESCRIPTION OF THE DRAWINGS

For a detailed description of various examples, reference will now be made to the accompanying drawings in which:

FIG. 5 shows a graph of detected interleaved ADC time error in the receiver physical layer circuitry of FIGS. 1A and 1B.

FIG. 6 shows a graph of interleaved ADC time error correction in the receiver physical layer circuitry of FIGS. 1A and 1B.

FIG. 7 shows a graph of mean squared error in receiver physical layer circuitry with and without application of time error correction to an interleaved ADC.

The same reference numbers are used in the drawings to illustrate the same or similar (by function and/or structure) features.

DETAILED DESCRIPTION

In high-speed applications, such as Ethernet, the sample rate of the analog-to-digital converter (ADC) that digitizes analog signals (e.g., received Ethernet signals) is quite high (e.g., approaching a gigahertz). In an Ethernet receiver, an interleaved ADC is used to reduce system cost, Interleaving errors caused by mismatches in the ADCs of the interleaved ADC affect the signal-to-noise ratio of the Ethernet receiver. Time interleaved ADCs suffer from offset, gain, and phase skew mismatches between the parallel ADCs. The noise produced by these mismatches is boosted by digital equalization in the receiver, and affects bit error rate (BER) performance and cable reach.

Some interleaved ADC systems that process narrow band signals include frequency domain error estimation and firmware-based post processing to correct time and/or gain mismatches in the interleaved ADCs. However, these added features (e.g. fast Fourier transform (FFT) and microprocessor hardware) increase system cost.

The receivers of some example embodiments provide mismatch correction across the ADCs of the interleaved ADC without FFT or microprocessor hardware. The receivers of some example embodiments include an interleaving ADC timing error detector circuit that corrects time offset errors in the interleaved ADC, The interleaving ADC timing error detector circuit compares the first post-cursor inter-symbol interference (ISI) of the ADCs, which is different due to sampling time offset across the ADCs, and applies the difference to control interleaving ADC time error correction using analog delay circuit in the clock paths to the ADCs. Post-cursor 131 refers to 131 resulting from a later transmitted symbol. Post-cursor ISI may be reduced using decision-feedback equalization.

The receivers of some example embodiments also include gain error correction circuitry. The gain error correction circuitry determines gain error across ADCs based on slicer inputs and outputs. The gain error is corrected using a multiplier in at least one ADC processing path.

Figure 1A:
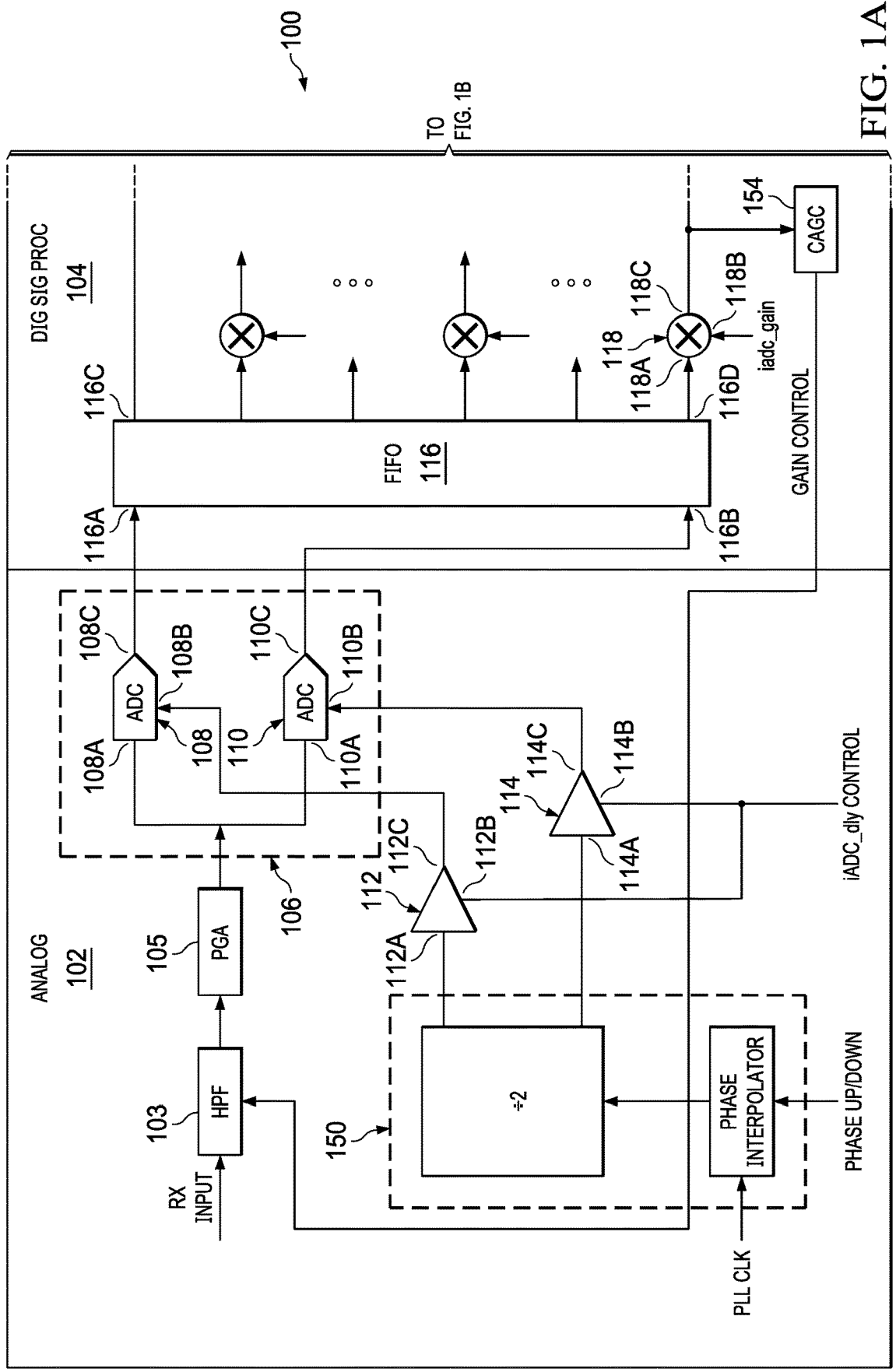
FIGS. 1A and 1B show a block diagram for example receiver physical layer circuitry that includes correction for interleaved analog-to-digital converter (ADC) time and gain errors.
Figure 1B:
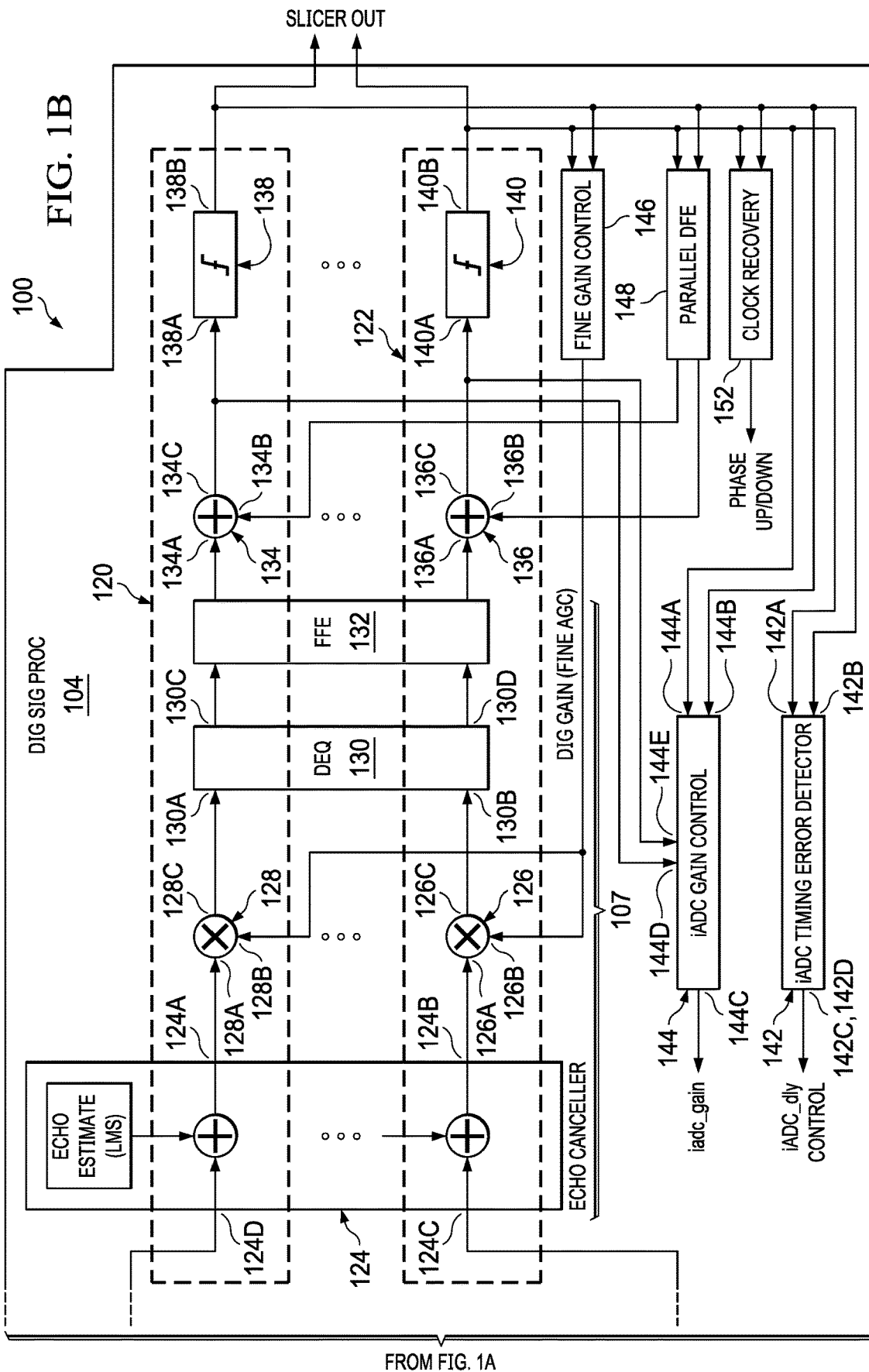

FIGS. 1A and 1B show a block diagram for example receiver physical layer circuitry (PHY) 100 that includes correction for interleaved ADC time and gain errors. Embodiments of the receiver physical layer circuitry may be applied in wireline receivers, such as Ethernet receivers, or in wireless receivers (such as cellular phone receivers and 5G receivers). The receiver physical layer circuitry 100 includes an analog front-end circuit 102 (shown in FIG. 1A) and a digital signal processing circuit 104 (shown in FIGS. 1A and 1B). The analog front-end circuit 102 receives transmitted signals and digitizes the received signals for processing by the digital signal processing circuit 104. The digital signal processing circuit 104 processes the digitized signals to compensate for the channel through which the signals pass to the digital signal processing circuit 104. The analog front-end circuit 102 includes an interleaved ADC 106, a clock source 150, a delay circuit 112, and a delay circuit 114. The clock source 150 generates clock signals that control the conversion timing of the interleaved ADC 106. In some implementations, the clock source 150 receives an input clock signal from an oscillator circuit, such as a phase-locked loop, allows the phase of the input clock signal to be adjusted (by adjusting a delay applied to the input clock signal) and divides the input clock signal by two for provision to the interleaved ADC 106. However, for the example embodiments that include M interleaved ADCs, the input clock signal would be divided by M. The interleaved ADC 106 includes an ADC 108 and an ADC 110 connected in parallel with the ADC 108. The ADCs 108 and 110 may be, for example, flash ADCs, pipeline ADCs or ADCs based on voltage-to-delay technology (e.g. ADCs based on a comparators/delays that work on the principal of comparisons based on signal delay as opposed to signal magnitudes). The ADC 108 includes an input 108A coupled to an input 110A of the ADC 110. The input 108A is coupled to a programmable gain amplifier (PGA) 105, and the PGA 105 is coupled to a high-pass filter circuit 103.

The delay circuit 112 passes a clock signal from the clock source 150 to the ADC 108. The delay circuit 114 passes a clock signal from the clock source 150 to the ADC 110. The delay circuit 112 and the delay circuit 114 delay the clock signals provided to the ADC 108 and the ADC 110 to compensate for variable delays in the ADC 108 and the ADC 110 or the clock paths to the ADC 108 and the ADC 110. The delay circuits 112 and 114 may include, for example, a selectable number of buffers connected in series to allow variation in delay. The delay circuit 112 includes an input 112A coupled to the clock source 150, an output 112C coupled to the clock input 108B of the ADC 108, and a control input 1126 coupled to the digital signal processing circuit 104 for receipt of a delay control signal. The delay circuit 114 includes an input 114A coupled to the clock source 150, an output 114C coupled to the clock input 1106 of the ADC 110, and a control input 1146 coupled to the digital signal processing circuit 104 for receipt of a delay control signal.

The digital signal processing circuit 104 includes a first-in-first-out (FIFO) memory 116. The FIFO memory 116 stores digital samples received from the interleaved ADC 106, and provides each sample to one of multiple processing channels. Processing channel 120 and processing channel 122 are shown in FIG. 1B. Processing channel 120 receives, from the FIFO memory 116, and processes digital samples produced by the ADC 108. Processing channel 122 receives, from the FIFO memory 116, and processes digital samples produced by the ADC 110. Thus, each processing channel processes digital samples produced from one of the ADC 108 or the ADC 110. Implementations of the digital signal processing circuit 104 include more than two processing channels. For example, an implementation of the digital signal processing circuit 104 includes six processing channels, where three of the processing channels process samples produced by the ADC 108, and three of the processing channels process samples produced by the ADC 110.

Each processing channel includes equalization and echo cancellation circuitry 107, an adder, and a slicer. The equalization and echo cancellation circuitry 107 includes echo cancellation circuitry 124, a multiplier circuit (e.g., multiplier 126 or 128), a digital equalizer 130, and a feed-forward equalizer 132. In the processing channel 120, the echo cancellation circuitry 124 is coupled to the digital equalizer 130 via the multiplier 128, and the feed-forward equalizer 132 is coupled to the slicer 138 via the adder 134. The echo cancellation circuitry 124 multiplies received symbols by echo cancellation coefficients to reduce echo in the received signal. The digital equalizer 130 is a digital filter that corrects for ISI due to the transmission channel. The feed-forward equalizer 132 corrects pre-cursor ISI (ISI resulting from a previously transmitted symbol). The feed-forward equalizer 132 may be implemented using a finite impulse response (FIR) filter. The multiplier 128 includes an input 128A coupled to the output 124A of the echo cancellation circuitry 124. An output 128C of the multiplier 128 is coupled to an input 130A of the digital equalizer 130. The adder 134 includes an input 134A coupled (via the feed-forward equalizer 132) to the output 130C of the digital equalizer 130, and an output 134C coupled to the input 138A of the slicer 138.

In the processing channel 122, the echo cancellation circuitry 124 is coupled to the digital equalizer 130 via the multiplier 126, and the feed-forward equalizer 132 is coupled to the slicer 140 via the adder 136. The multiplier 126 includes an input 126A coupled to the output 124B of the echo cancellation circuitry 124. An output 126C of the multiplier 126 is coupled to an input 130B of the digital equalizer 130. The adder 136 includes an input 136A coupled (via the feed-forward equalizer 132) to the output 130D of the digital equalizer 130, and an output 136C coupled to the input 140A of the slicer 140.

The digital signal processing circuit 104 includes a fine gain control circuit 146, a decision feedback equalizer (DFE) circuit 148, a clock recovery circuit 152, an interleaving ADC gain control circuit 144, and an interleaving ADC timing error detector circuit 142, each of which is coupled to the slicer 138 and/or the slicer 140. The fine gain control circuit 146 compares the received signal at the slicers to a predetermined amplitude value, and sets the gain (or attenuation) provided via the multipliers (e.g., the multipliers 126 and 128) coupled to the echo cancellation circuitry 124 to bring the received signal to the predetermined amplitude. The fine gain control circuit 146 is coupled to an input 128B of the multiplier 128 and an input 126B of the multiplier 126 to control the fine gain applied to the output of the echo cancellation circuitry 124 by the multiplier 128 and the multiplier 126.

The DFE circuit 148 is used to cancel post-cursor ISI. It stores the past symbol decisions in a shift register. DFE circuit 148 also estimates DFE coefficients (or the post-cursor values) and stores the past symbol decisions in a shift register. The coefficients are applied to weight the stored past symbol decisions and recreate the post-cursor ISI to subtract at the slicer input. The DFE circuit 148 is coupled to an input 134B of the adder 134 and an input 1366 of the adder 136 to provide equalization feedback to the input of the slicer 138 and the slicer 140.

The clock recovery circuit 152 estimates the clock phase from the received signal, and adjusts, in the clock source 150, the delay applied to the clock signal to set the phase of the clock signals provided to the delay circuit 112 and the delay circuit 114. The goal of the phase adjustment is to set the edge timing of the clock signals to sample the received signal at the optimum point.

The ADC gain control circuit 144 adjusts the gain of signal in the processing channel 122 to equalize the amplitude of samples output by the ADC 108 and samples output by the ADC 110. An input 144A of the ADC gain control circuit 144 is coupled to the output 1406 of the slicer 140. An input 144B of the ADC gain control circuit 144 is coupled to the output 138B of the slicer 138. An input 144D of the ADC gain control circuit 144 is coupled to the input 138A of the slicer 138. An input 144E of the ADC gain control circuit 144 is coupled to the input 140A of the slicer 140. A multiplier 118 is coupled between the FIFO memory 116 and the echo cancellation circuitry 124 to adjust the amplitude of samples produced by the ADC 110 based on control (a multiplier value) provided by the ADC gain control circuit 144. The multiplier 118 includes an input 118A coupled to an output 116D of the FIFO memory 116, an input 118B coupled to the output 144C of the ADC gain control circuit 144, and an output 118C coupled to an input 124C of the echo cancellation circuitry 124. An input 124D of the echo cancellation circuitry 124 is coupled an output 116C of the FIFO memory 116. Thus, gain adjustment is provided to the digital samples generated by the ADC 110, and no gain adjustment is provided to the digital samples generated by the ADC 108. That is, the gain applied to the digital samples generated by the ADC 110 is made equal to that applied to the digital samples generated by the ADC 108. In an alternative example embodiment, gain adjustment is provided to both the digital samples generated by ADC 108 and ADC 110.

The ADC gain control circuit 144 determines the gain error of the ADC 110 relative to the ADC 108 based on the inputs and output of the slicers 138 and 140. Noise at the slicers 138 and 140 is reduced relative to noise earlier in the processing path because echo is cancelled by the echo cancellation circuitry 124 and ISI is removed by the DFE circuit 148. The ADC gain control circuit 144 exploits the Ethernet modulation (PAM-3) to determine gain error of the interleaved ADC 106 without using a multiplier or squarer to compute signal power. PAM-3 is only three levels (1, 0, and −1). The ADC gain control circuit 144 folds the values to a positive number, applies a simple subtraction, and returns a non-zero value only when both symbol decisions are non-zero. Otherwise, determination of gain error would require a multiplier or squarer. The ADC gain control circuit 144 computes gain error as:

$$iGainErr = (abs(y_1) - abs(y_0)) * abs(\hat{y}_1) * abs(\hat{y}_0) \quad (1)$$

where:
$y_1$ is signal input to the slicer 140;
$y_0$ is signal input to the slicer 138;
$\hat{y}_1$ is signal output by the slicer 140; and
$\hat{y}_0$ is signal output by the slicer 138; and
iGainErr is a gain error value applied to correct the gain of the of the ADC 110 relative to the ADC 108. Gain correction is updated when the outputs of the slicers 138 and 140 are non-zero.

Figure 2:
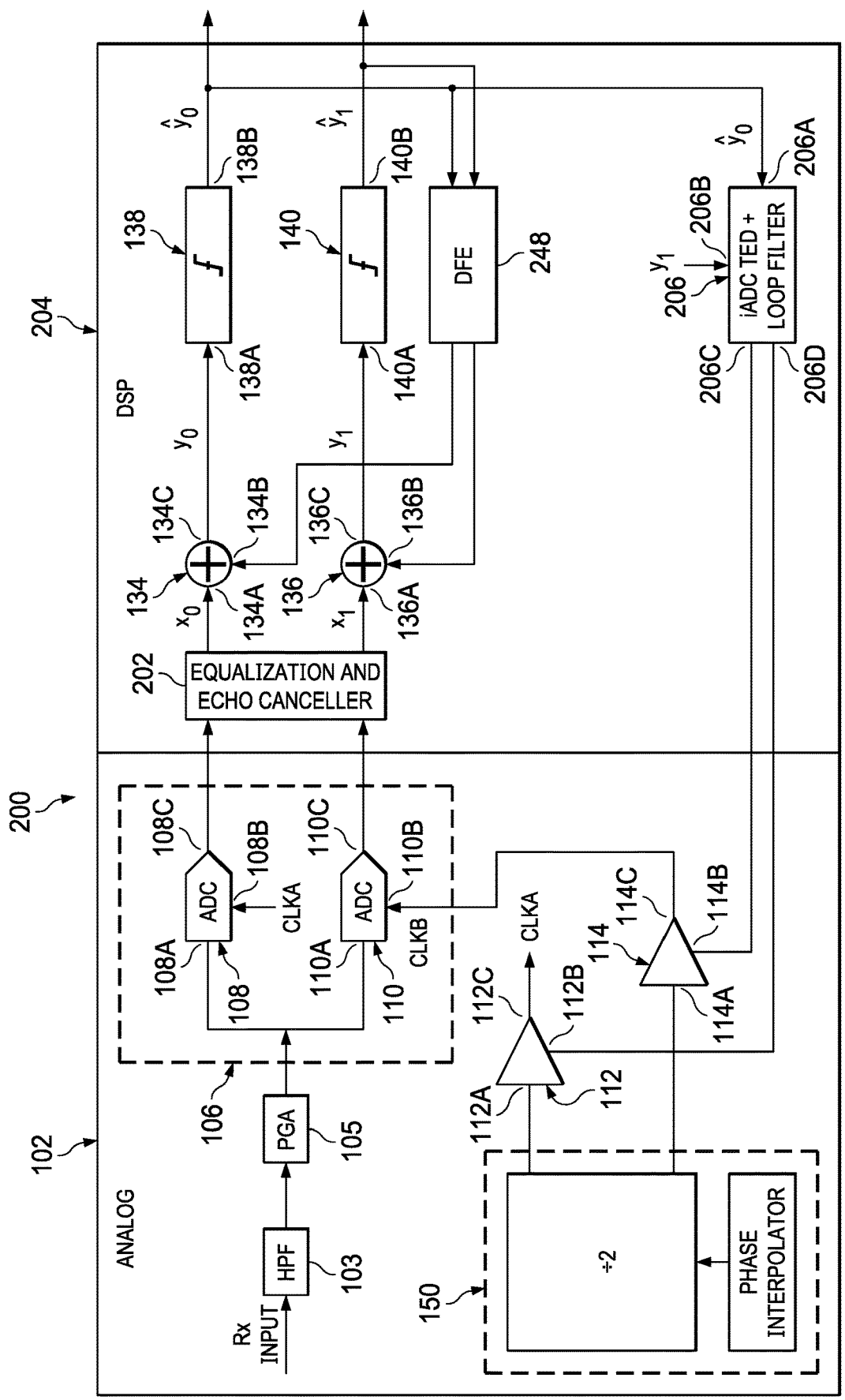
FIG. 2 shows a block diagram for example receiver physical layer circuitry that corrects for interleaved ADC time errors using error of a single slicer.
Figure 3:
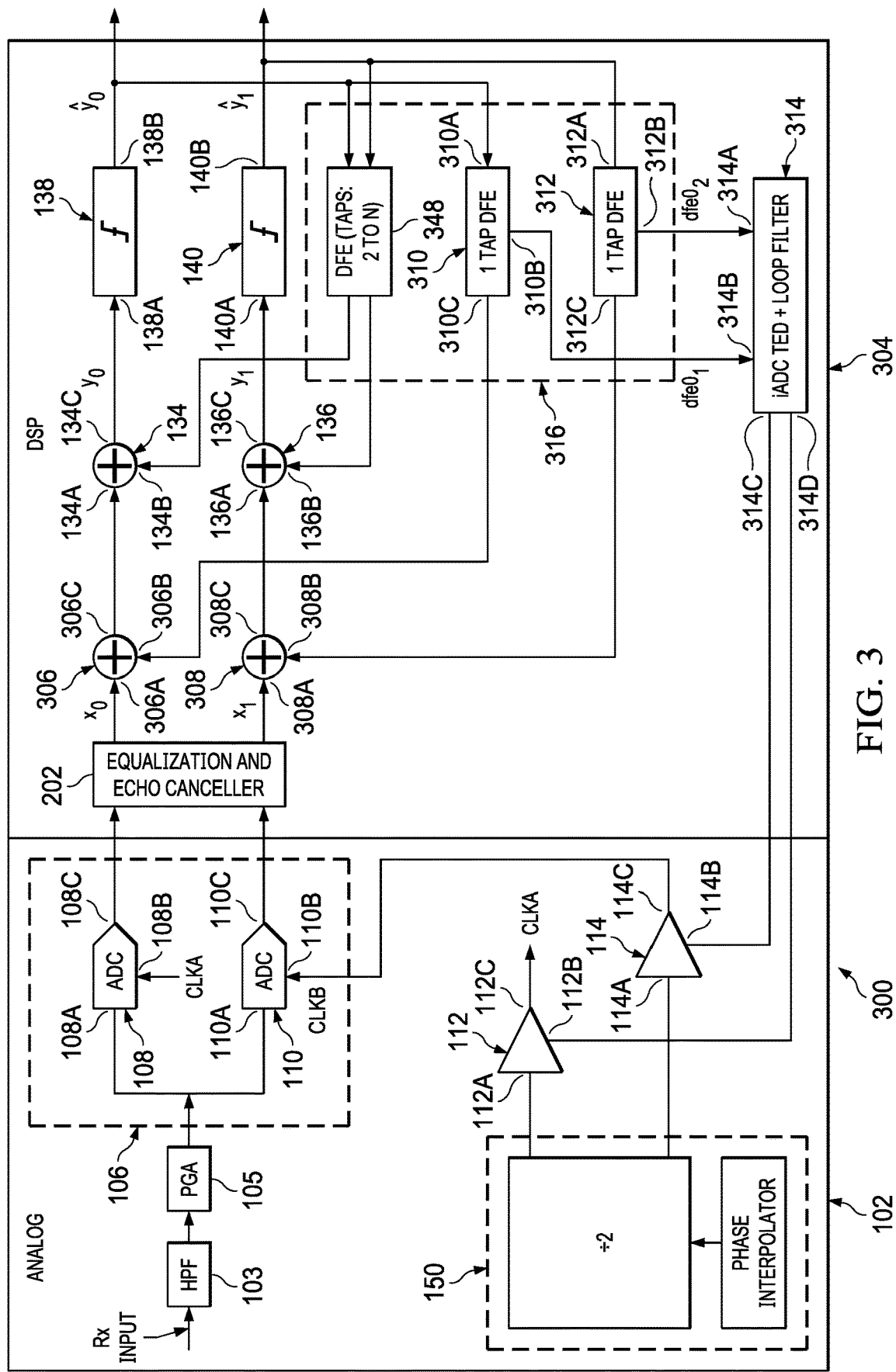
FIG. 3 shows a block diagram for example receiver physical layer circuitry that corrects for interleaved ADC time errors by comparing post-cursor inter-symbol interference between ADCs.

The interleaving ADC timing error detector circuit 142 determines the timing error of the ADC 110 relative to the ADC 108 based on the outputs and the inputs of the slicers 138 and 140. In the receiver physical layer circuitry 100, ISI seen by the processing channels coupled to the ADC 108 and the ADC 110 is different due to sampling time offset in the ADC 108 and ADC 110. The interleaving ADC timing error detector circuit 142 compares the post-cursor ISI seen in the processing channels 120 and 122 to steer the timing of the interleaved ADC 106 using the delay circuit 112 and the delay circuit 114. The interleaving ADC timing error detector circuit 142 includes an output 142C coupled to the control input 1126 of the delay circuit 112, and an output 142D coupled the control input 1146 of the delay circuit 114 for controlling the delay of the delay circuit 112 and the delay circuit 114. FIGS. 2 and 3 show embodiments of the interleaving ADC timing error detector circuit 142.

In the receiver physical layer circuitry 100, the timing and gain error correction for the interleaved ADC 106 is implemented early in the data path. The error correction is implemented ahead of the echo cancellation circuitry 124 so that the echo cancellation circuitry 124 receives error corrected data. Similarly, the digital equalization and timing recovery operations are independent of timing and gain errors originating in the interleaved ADC 106.

FIG. 2 shows a block diagram for example receiver physical layer circuitry 200 that corrects for interleaved ADC time errors using error of a single slicer. The receiver physical layer circuitry 200 is an implementation of the receiver physical layer circuitry 100. The receiver physical layer circuitry 200 includes the analog front-end circuit 102 and a digital signal processing circuit 204. The digital signal processing circuit 204 includes equalization and echo cancelation circuitry 202, the adder 134, the adder 136, the slicer 138, the slicer 140, a DFE 248, and interleaving ADC timing error detector circuit 206. The equalization and echo cancelation circuitry 202 includes the FIFO memory 116, the multiplier 118, and the equalization and echo cancellation circuitry 107 shown in FIGS. 1A and 1B. While only two processing paths are shown in FIG. 2, implementations of the receiver physical layer circuitry 200 include any number of processing paths to process samples generated by the ADC 108 and the ADC 110. In alternative example embodiments, more (or fewer) processing paths may be utilized and/or more (or fewer) ADCs may be utilized.

The interleaving ADC timing error detector circuit 206 estimates the residual ISI of the processing channel that processes digital samples generated by the ADC 110. The DFE 248 is designed to cancel only the ISI present in the processing channel that processes digital samples generated by the ADC 108, because only the slicer error of the slicer 138 is used for least mean square adaptation of the DFE coefficients in the DFE 248. The interleaving ADC timing error detector circuit 206 uses residual ISI of the processing channel that processes digital samples generated by the ADC 110 for time error detection and correction of timing error in the interleaved ADC 106. The interleaving ADC timing error detector circuit 206 computes timing error as:

$$ited = -\sum_{l} \hat{y}_0(l) \cdot y_1(l) \qquad (2)$$

where:
$\hat{y}_0$ is a channel symbol decision produced by the slicer 138;
$y_1$ is symbol input to the slicer 140; and
ited is the interleaving ADC timing error value used to correct the timing of the ADC 108 and ADC 110 via the delay circuit 112 and the delay circuit 114, and thereby reduce the error value (i.e., reduce the difference in the ISI seen in the two processing channels).

Equation (2) represents a correlation of $\hat{y}_0$ and $\hat{y}_1$. If there is no error in timing of the ADCs 108 and 110, then the correlation output is 0, because the ISI is cancelled by the DFE 248, and the DFE 248 is used to estimate the coefficients applied to generate $y_0$. So, if there is no interleaving ADC time error, then equation (2) produces zero. The correlation output is non-zero (either positive or negative depending on the sign of the time error) if there is error in timing of the ADCs 108 and 110.

The interleaving ADC timing error detector circuit 206 filters the timing error to produce a timing error correction. The filtering may integrate timing error detection output (per equation 2). If the integrated timing error crosses a threshold, then a timing error correction provided to the delay circuits 112 and 114 may change to adjust clock timing. When the timing error correction generated by the interleaving ADC timing error detector circuit 206 is applied to the delay circuit 112 and the delay circuit 114 (and thereby to the interleaved ADC 106), the DFE error of the processing channel that processes digital samples generated by the ADC 108 is automatically corrected.

The interleaving ADC timing error detector circuit 206 includes an input 206A coupled to the output 138B of the slicer 138, an input 206B coupled to the input 140A of the slicer 140. An output 206C of the interleaving ADC timing error detector circuit 206 is coupled to the control input 114B of the delay circuit 114, and an output 206D of the interleaving ADC timing error detector circuit 206 is coupled to the control input 112B of the delay circuit 112.

FIG. 3 shows a block diagram for example receiver physical layer circuitry 300 that corrects for interleaved ADC time errors by comparing post-cursor ISI between ADCs. The receiver physical layer circuitry 300 is an implementation of the receiver physical layer circuitry 100. The receiver physical layer circuitry 300 includes the analog front-end circuit 102 and a digital signal processing circuit 304. The digital signal processing circuit 304 includes equalization and echo cancelation circuitry 202, an adder 306, an adder 308, the adder 134, the adder 136, the slicer 138, the slicer 140, a DFE 316, and interleaving ADC timing error detector circuit 314. The equalization and echo cancelation circuitry 202 includes the FIFO memory 116, the multiplier 118, and the equalization and echo cancellation circuitry 107 shown in FIGS. 1A and 1B. While only two processing paths are shown in FIG. 3, implementations of the receiver physical layer circuitry 300 include any number of processing paths to process samples generated by the ADC 108 and the ADC 110.

The adder 306 includes an input 306A coupled to the equalization and echo cancelation circuitry 202, and an output 306C coupled to the input 134A of the adder 134. The adder 308 includes an input 308A coupled to the equalization and echo cancelation circuitry 202, and an output 308C coupled to the input 136A of the adder 136. The adder 306 sums first tap DFE data with the digital samples generated by the ADC 110 received from the equalization and echo cancelation circuitry 202. The adder 308 sums first tap DFE data with the digital samples generated by the ADC 108 received from the equalization and echo cancelation circuitry 202. The adder 134 sums output of the adder 306 with DFE data for higher order taps. The adder 136 sums output of the adder 308 with DFE data for higher order taps.

The DFE 316 is split to estimate the first tap independently for each of two processing channels that process digital samples from the ADC 108 and the ADC 110. In the presence of interleaving ADC timing error, the DFE coefficients applied in the first taps of the two processing channels will be different. The difference between the coefficients is used to detect interleaving ADC timing error. The remainder of the DFE taps (taps other than the first tap) are common for both processing channels to reduce circuit complexity. The first tap of one processing channel is subtracted from the other for time error detection and correction of timing error in the interleaved ADC 106.

The DFE 316 includes a first DFE tap 310, a first DFE tap 312, and DFE taps 348 (DFE taps 2-N). First DFE tap 312 includes an input 312A coupled to the output 140B of the slicer 140. An output 312C of the first DFE tap 312 is coupled to an input 308B of the adder 308 for provision of first tap DFE data to the adder 308. An output 310C of the first DFE tap 310 is coupled to an input 306B of the adder 306 for provision of first tap DFE data to the adder 306. The DFE taps 348 (taps 2-N of the N taps of the DFE 316) are coupled to the input 1346 of the adder 134 and the input 1366 of the adder 136 for provision of DFE tap data to the adder 134 and the adder 136.

The interleaving ADC timing error detector circuit 314 is coupled to the first DFE tap 310 and the first DFE tap 312 for receipt of first tap DFE data. The interleaving ADC timing error detector circuit 314 subtracts the first tap DFE data received from the first DFE tap 312 from the first tap DFE data received from the first DFE tap 310 and filters the difference value for time error detection and correction of timing error in the interleaved ADC 106.

$$ited = dfe0_1 - dfe0_2 \tag{3}$$

where:

$dfe0_1$ is the ISI seen in a processing channel that processes digital samples from the ADC 108 (e.g., the feedback value provided to the adder 306 by the first DFE tap 310);

$dfe0_2$ is the ISI seen in a processing channel that processes digital samples from the ADC 110 (e.g., the feedback value provided to the adder 308 by the first DFE tap 312); and ited is the error value used to correct the timing of the ADC 108 and ADC 110 via the delay circuit 112 and the delay circuit 114, and thereby reduce the error value (i.e., reduce the difference in the ISI seen in the two processing channels).

The interleaving ADC timing error detector circuit 314 includes an input 314A coupled to an output 312B of the first DFE tap 312, and an input 314B coupled to an output 3106 of the first DFE tap 310. An output 314C of the interleaving ADC timing error detector circuit 314 is coupled to the control input 114B of the delay circuit 114, and an output 314D of the interleaving ADC timing error detector circuit 314 is coupled to the control input 1126 of the delay circuit 112.

Figure 4:
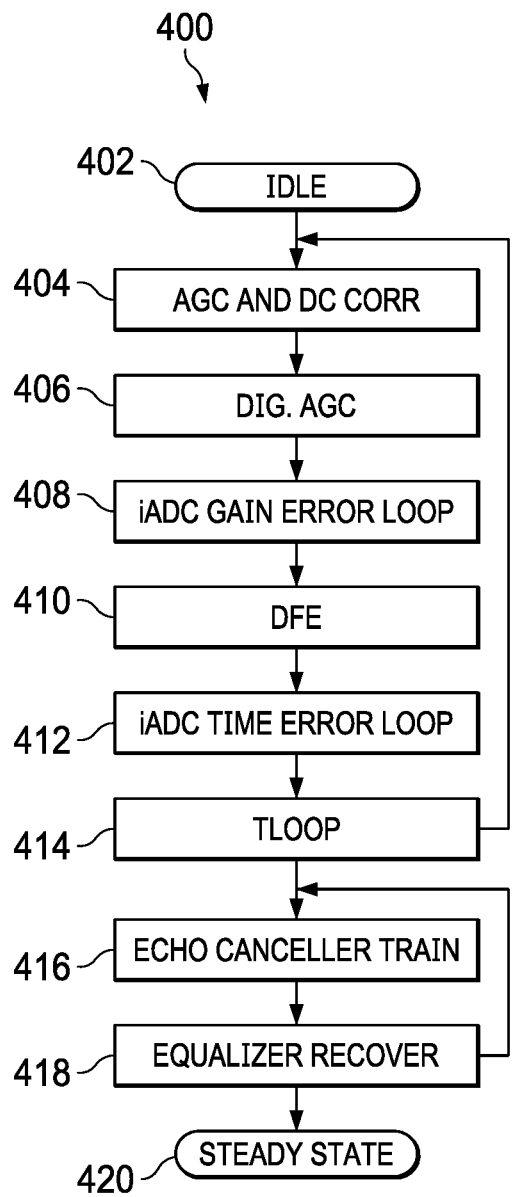
FIG. 4 shows a flow diagram for a method for interleaved ADC error correction in a receiver.

FIG. 4 shows a flow diagram for a method 400 for interleaved ADC error correction in a receiver. Though depicted sequentially as a matter of convenience, at least some of the actions shown can be performed in a different order and/or performed in parallel. Additionally, some implementations may perform only some of the actions shown. Operations of the method 400 are performed by an implementation of the receiver physical layer circuitry 100.

In block 402, Ethernet signal is received, and the receiver physical layer circuitry 100 begins initialization to allow operation.

In blocks 404-408, gain applied in the receiver physical layer circuitry 100 is adjusted. In block 404, the coarse automatic gain control (CAGC) circuit 154 analyzes the amplitude of signal output of the multiplier 118 (the gain of the multiplier 118 may be unity) and adjusts the amplitude to a predetermined range by providing a coarse gain control signal to the high-pass filter circuit 103. The high-pass filter circuit 103 adjusts the gain applied to the received Ethernet signal to bring the signal amplitude within the predetermined range for digitization by the interleaved ADC 106. The predetermined range may be, for example, in a range of one-half to three-quarters of ADC full-scale or other range that allows sufficient ADC headroom and dynamic range.

In block 406, the fine gain control circuit 146 analyzes the amplitude of signal output of the slicer 138 and the slicer 140 and adjusts the amplitude of slicer input to a predetermined range (providing sufficient ADC headroom and dynamic range) by providing a fine gain control multiplier value to the multipliers coupled to the outputs of the echo cancellation circuitry 124 (e.g., the multiplier 126 and the multiplier 128). The multipliers adjust the gain echo cancelled signal to bring the signal amplitude within the predetermined range.

In block 408, the ADC gain control circuit 144 determines the gain error of the ADC 110 relative to the ADC 108 based on the inputs and output of the slicers 138 and 140. The ADC gain control circuit 144 provides a multiplier value to the multipliers coupled to the outputs of the FIFO memory 116 (e.g., the multiplier 118). The multiplier value adjusts the gain of digital samples received from the ADC 110 (via the FIFO memory 116) so that the amplitude of the digital samples received from the ADC 108 and the ADC 110 is equal at the inputs of the echo cancellation circuitry 124.

In block 410, the DFE circuit 148 applies the slicer output data to remove ISI from the signal at the inputs of the slicers.

In block 412, the interleaving ADC timing error detector circuit 142 compares post cursor ISI of processing channels for the ADC 108 and the ADC 110. Based on the difference in the ISI for the processing channels, the interleaving ADC timing error detector circuit 142 adjusts the timing of the clocks provided to the ADC 108 and ADC 110 to reduce the timing error (reduce the difference in ISI). The interleaving ADC timing error detector circuit 142 provides delay control signals to the delay circuit 112 and the delay circuit 114 to steer the timing of the interleaved ADC 106.

In block 414, the phase of the clock signals output by the clock source 150 is adjusted by the clock recovery circuit 152.

In block 416, the echo cancellation circuitry 124 is trained to reduce the amplitude of echo signal at the outputs of the echo cancellation circuitry 124. The gain, timing, and equalization adjustments of blocks 404-414 are frozen (e.g., held at a last determined value) during the echo cancellation training in some implementations of the method 400.

In block 418, the gain, timing, and equalization adjustments of blocks 404-414 are re-enabled, and the receiver physical layer circuitry 100 processes received signal in steady state operation in block 420.

FIG. 5 shows a graph of interleaved ADC time error detected by the interleaving ADC timing error detector circuit 142. In FIG. 5, the y-axis represents timing error detector output, and the x-axis represents time. At time 0, signal 510 shows a time error of +103 picoseconds (ps), signal 512 shows a time error of −103 ps, and signal 514 shows a time error of 0 ps. The digital (fine) AGC is enabled in interval 502, and the DFE is enabled in interval 504. In interval 506, the interleaving ADC timing error detector circuit 142 is enabled to correct time error in the interleaved ADC 106, and the time error detected by the interleaving ADC timing error detector circuit 142 is reduced to 0. In interval 508, the clock recovery circuit 152 is enabled to adjust overall clock phase.

FIG. 6 shows a graph of delay correction in the interleaved ADC 106. In FIG. 6, the y-axis represents timing error in pico-seconds, and the x-axis represents time. Time errors of +/−103 ps and 0 ps are present at time 0. The digital (fine) AGC is enabled in interval 602, and the DFE is enabled in interval 604. In interval 606, the interleaving ADC timing error detector circuit 142 is enabled and the delay of the delay circuit 112 and/or the delay circuit 114 is step-wise adjusted to reduce timing error in the ADC 108 and the ADC 110 to zero. In interval 608, the clock recovery circuit 152 is enabled to adjust overall clock phase.

FIG. 7 shows a comparison of relative mean squared error at the slicers (e.g. slicers 138 and 140) with and without ADC time error correction. MSE 702 corresponds to an initial time error of +103 ps with timing error correction. MSE 704 corresponds to an initial time error of +103 ps with no timing error correction. MSE 706 corresponds to an initial time error of 0 ps. In interval 708, the MSE 702 is the same as the MSE 706 due to application of timing error correction. That is, the initial +103 ps time error corresponding to MSE 702 has been reduced to be about the same as the 0 ps time error of MSE 706. Because no time error correction is applied to the +103 ps initial time error corresponding to the MSE 704, the MSE 704 is higher than the MSE 702 in the interval 708.

While timing and gain error correction have been discussed herein with respect to a receiver, implementations of the time and error correction circuits described herein are applicable to a variety of systems that employ an interleaved ADC. Furthermore, implementations of the time and error correction circuits described herein are suitable for correcting time and gain errors in interleaved ADCs that include any number of parallel ADCs.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

Modifications are possible in the described embodiments, and other embodiments are possible, within the scope of the claims.

What is claimed is:

1. A receiver circuit, comprising:
    an interleaved analog-to-digital converter (ADC) including:
        a first ADC having a clock input; and
        a second ADC having a clock input and coupled in parallel with the first ADC;
    a first delay circuit including:
        a clock input adapted to be coupled to a clock source;
        a control input; and
        a clock output coupled to the clock input of the first ADC;
    a second delay circuit including:
        a clock input adapted to be coupled to the clock source;
        a control input; and
        a clock output coupled to the clock input of the second ADC;
    a first-in-first-out (FIFO) memory coupled to the interleaved ADC;
    a processing channel coupled to the FIFO memory, and including:
        a slicer having an output;
    an interleaving ADC timing error detector circuit including:
        an input coupled to the output of the slicer;
        a first output coupled to the control input of the first delay circuit; and
        a second output coupled to the control input of the second delay circuit.

2. The receiver circuit of claim 1, wherein:
    the processing channel is a first processing channel;
    the slicer is a first slicer;
    the input of the interleaving ADC timing error detector circuit is a first input; and
    the receiver circuit includes:
        a second processing channel coupled to the FIFO memory, and including:
            a second slicer having an input and an output; and
        the interleaving ADC timing error detector circuit includes:
            a second input coupled to the input or the output of the second slicer.

3. The receiver circuit of claim 2, further comprising:
    a first decision feedback equalizer (DFE) tap including:
        an input coupled to the output of the first slicer; and
        an output coupled to the first input of the timing error detector; and
    a second DFE tap including:
        an input coupled to the output of the second slicer; and
        an output coupled to the second input of the interleaving ADC timing error detector circuit.

4. The receiver circuit of claim 2, wherein:
    the first slicer has an input;
    the receiver circuit includes:
        an ADC gain control circuit including:
            a first input coupled to the output of the first slicer;
            a second input coupled to the output of the second slicer;
            a third input coupled to the input of the first slicer;
            a fourth input coupled to the input of the second slicer; and
            an output; and
        the second processing channel includes:
            a multiplier circuit including:
                a first input coupled to the FIFO memory;
                a second input coupled to the output of the ADC gain control circuit; and
                an output.

5. A receiver circuit, comprising:
    an interleaved analog-to-digital converter (ADC) including:
        a first ADC; and
        a second ADC in parallel with the first ADC;
    a first delay circuit configured to delay a first clock signal provided to the first ADC;

a second delay circuit configured to delay a second clock signal provided to the second ADC;
a first processing channel configured to process data samples provided by the first ADC, and including a first slicer;
a second processing channel configured to process data samples provided by the second ADC, and including a second slicer; and
an interleaving ADC timing error detector circuit configured to control a first delay of the first delay circuit and a second delay of the second delay circuit responsive to an output signal of the first slicer and either an output signal or an input signal of the second slicer.

6. The receiver circuit of claim 5, wherein the interleaving ADC timing error detector circuit is configured to generate an interleaving ADC timing error value as a correlation of the output signal of the first slicer and the input signal of the second slicer.

7. The receiver circuit of claim 6, further comprising a decision feedback equalizer configured to reduce only inter-symbol interference present in the first processing channel.

8. The receiver circuit of claim 5, further comprising:
a decision feedback equalizer including:
a first ADC first tap circuit configured to reduce inter-symbol interference in the first processing channel; and
a second ADC first tap circuit configured to reduce inter-symbol interference in the second processing channel;
wherein the interleaving ADC timing error detector circuit is configured to control the first delay circuit and the second delay circuit based on output of the first ADC first tap circuit and output of the second ADC first tap circuit.

9. The receiver circuit of claim 8, wherein the interleaving ADC timing error detector circuit is configured to generate an interleaving ADC timing error value as a difference of the output of the first ADC first tap circuit and the output of the second ADC first tap circuit.

10. The receiver circuit of claim 8, wherein:
the output of the first ADC first tap circuit represents inter-symbol interference in the first processing channel; and
the output of the second ADC first tap circuit represents inter-symbol interference in the second processing channel.

11. The receiver circuit of claim 8, wherein the decision feedback equalizer includes N taps and taps 2-N are applied to reduce ISI in the first processing channel and the second processing channel.

12. The receiver circuit of claim 5, further comprising:
an ADC gain control circuit configured to adjust an amplitude of data samples provided by the second ADC based on input of the first slicer, output of the first slicer, input of the second slicer, and output of the second slicer.

13. The receiver circuit of claim 12, wherein the second processing channel includes a multiplier circuit configured to adjust the amplitude of the data samples provided by the second ADC based on a multiplier value provided by the ADC gain control circuit.

14. The receiver circuit of claim 12, wherein the ADC gain control circuit is configured to generate a gain error value as a product of 1) the output of the first slicer, 2) the output of the second slicer, and 3) a difference of the input of the first slicer and the input of the second slicer.

15. A receiver circuit, comprising:
an analog front-end circuit, including:
an interleaved analog-to-digital converter (ADC) including:
a first ADC; and
a second ADC;
a digital signal processing circuit coupled to the analog front-end circuit, and including:
a first processing channel configured to process data samples provided by the first ADC, and including a first slicer;
a second processing channel configured to process data samples provided by the second ADC, and including a second slicer; and
an ADC gain control circuit configured to adjust an amplitude of data samples provided by the second ADC responsive to: input of the first slicer, output of the first slicer, input of the second slicer, and output of the second slicer.

16. The receiver circuit of claim 15, wherein the ADC gain control circuit is configured to generate a gain error value as a product of 1) the output of the first slicer, 2) the output of the second slicer, and 3) a difference of the input of the first slicer and the input of the second slicer.

17. The receiver circuit of claim 15, wherein the second processing channel includes a multiplier circuit configured to adjust the amplitude of the data samples provided by the second ADC based on a multiplier value provided by the ADC gain control circuit.

18. The receiver circuit of claim 15, wherein:
analog front-end circuit includes:
a first delay circuit configured to delay a first clock signal provided to the first ADC;
a second delay circuit configured to delay a second clock signal provided to the second ADC;
the digital signal processing circuit includes:
an interleaving ADC timing error detector circuit configured to control a first delay of the first delay circuit and a second delay of the second delay circuit based on an output signal of the first slicer and either an output signal or an input signal of the second slicer.

19. The receiver circuit of claim 18, wherein the interleaving ADC timing error detector circuit is configured to generate an interleaving ADC timing error value as a correlation of the output signal of the first slicer and the input signal of the second slicer.

20. The receiver circuit of claim 19, wherein the digital signal processing circuit includes a decision feedback equalizer configured to reduce only inter-symbol interference present in the first processing channel.

21. The receiver circuit of claim 18, wherein the digital signal processing circuit includes:
a decision feedback equalizer including:
a first ADC first tap circuit configured to reduce inter-symbol interference in the first processing channel; and
a second ADC first tap circuit configured to reduce inter-symbol interference in the second processing channel;
wherein the interleaving ADC timing error detector circuit is configured to control the first delay circuit and the second delay circuit based on output of the first ADC first tap circuit and output of the second ADC first tap circuit.

22. The receiver circuit of claim 21, wherein the interleaving ADC timing error detector circuit is configured to generate an interleaving ADC timing error value as a difference of the output of the first ADC first tap circuit and the output of the second ADC first tap circuit.

23. The receiver circuit of claim 21, wherein the decision feedback equalizer includes N taps and taps 2-N are applied to reduce ISI in the first processing channel and the second processing channel.

24. A method, comprising:
digitizing a signal using a first analog-to-digital converter (ADC) and a second ADC of an interleaving ADC;
determining a timing error of the second ADC relative to the first ADC by comparing inter-symbol interference (ISI) in the samples of the first ADC and ISI in the samples of the second ADC; and
adjusting a timing of a first clock provided to the first ADC or a timing of a second clock provided to the second ADC based on the timing error.

25. The method of claim 24, further comprising:
determining a gain error of the second ADC relative to the first ADC; and
adjusting a gain applied to samples of the second ADC responsive to the gain error.

26. The method of claim 25, further comprising determining the gain error based on input and output of a first slicer that processes the samples of the first ADC, and input and output of a second slicer that processes the samples of the second ADC.

27. The method of claim 24, further comprising determining the timing error as a correlation of output of a first slicer that processes the samples of the first ADC, and input of a second slicer that processes the samples of the second ADC.

28. The method of claim 24, further comprising:
applying a decision feedback equalizer (DFE) to the samples of the first ADC and the samples of the second ADC, the DFE including:
a first ADC first tap circuit that processes output of a first slicer coupled to the first ADC; and
a second ADC first tap circuit that processes output of a second slicer coupled to the second ADC; and
determining the timing error as a difference of output of the first ADC first tap circuit and output of the second ADC first tap circuit.

* * * * *